US008596337B2

(12) United States Patent
Weaver

(10) Patent No.: US 8,596,337 B2
(45) Date of Patent: Dec. 3, 2013

(54) SYSTEM AND METHOD FOR ACTIVE COOLING UTILIZING A RESONANT SHEAR TECHNIQUE

(75) Inventor: Matthew Weaver, Aptos, CA (US)

(73) Assignee: Lumenetix, Inc., Scotts Valley, CA (US)

( * ) Notice: Subject to any disclaimer, the term of this patent is extended or adjusted under 35 U.S.C. 154(b) by 1317 days.

(21) Appl. No.: 12/393,988

(22) Filed: Feb. 26, 2009

(65) Prior Publication Data

US 2009/0218074 A1 Sep. 3, 2009

Related U.S. Application Data

(60) Provisional application No. 61/032,991, filed on Mar. 2, 2008.

(51) Int. Cl.
*H05K 7/20* (2006.01)

(52) U.S. Cl.
USPC .................................. 165/80.3; 165/109.1

(58) Field of Classification Search
USPC ..................... 165/80.3, 109.1, 121; 361/697
See application file for complete search history.

(56) References Cited

U.S. PATENT DOCUMENTS

| | | | | |
|---|---|---|---|---|
| 4,923,000 | A * | 5/1990 | Nelson | 165/122 |
| 5,522,712 | A * | 6/1996 | Winn | 417/436 |
| 6,628,522 | B2 | 9/2003 | Trautman et al. | |
| 7,282,837 | B2 * | 10/2007 | Scher et al. | 310/328 |
| 2002/0056543 | A1 * | 5/2002 | Lim et al. | 165/80.3 |
| 2004/0190305 | A1 * | 9/2004 | Arik et al. | 362/555 |
| 2007/0037506 | A1 * | 2/2007 | Lee et al. | 454/184 |

FOREIGN PATENT DOCUMENTS

| | | | | |
|---|---|---|---|---|
| JP | 01233796 | A * | 9/1989 | H05K 7/20 |
| JP | 08330488 | A * | 12/1996 | H01L 23/467 |

* cited by examiner

*Primary Examiner* — Allen Flanigan
(74) *Attorney, Agent, or Firm* — Perkins Coie LLP

(57) ABSTRACT

An active cooling assembly is described. One embodiment of the active cooling assembly includes a fin configured to enable convective heat transfer to an airflow passing over the fin. A boundary layer accumulates between the fin and the airflow, and the boundary layer includes a region of heated air attached to a side of the fin. The embodiment also includes a blade configured to oscillate proximate to the fin to shear the boundary layer that accumulates between the fin and the airflow. The region of heated air is sheared from the side of the fin so that the impedance attributable to the boundary layer of the convective heat transfer from the fin to the airflow is reduced. The fin is coupled to a stationary arm, and the blade is coupled to a swing arm. The swing arm and a spring are driven at a resonant frequency by an actuator.

21 Claims, 6 Drawing Sheets

SYSTEM AND METHOD FOR ACTIVE COOLING UTILIZING A RESONANT SHEAR TECHNIQUE

CLAIM OF PRIORITY

This application claims priority to U.S. Provisional Patent Application No. 61/032,991 entitled "HEAT SINKING USING A RESONANT SHEER TECHNIQUE," which was filed on Mar. 2, 2008, the contents of which are expressly incorporated by reference herein.

BACKGROUND

There are a variety of lighting applications that require continuous operation. For example, facilities that are open and in use continuously day and night, such as airports, hospitals, and public attractions are often continuously lit. Light Emitting Diodes ("LEDs") have become strong candidates for such continuous lighting applications, because they have the longest published life of available light sources. LEDs have unique advantages over other lighting solutions. For example, they operate at a high efficiency to produce more light output with lower input power, and have an inherently longer service life.

Unlike incandescent bulbs and fluorescent lights, LEDs are semiconductor devices that conventionally must operate at lower temperatures. LEDs typically remove heat by conduction from the LED p-n junction to the case of the LED package before being dissipated. Conventional LED packages typically employ various heat removal schemes. The effectiveness of the heat removal scheme determines how well such LEDs perform, as cooler running temperatures yield higher efficacy for a given level of light output, and longer overall lifetime.

One conventional passive approach to cooling LEDs in continuous lighting applications provides a finned heat sink exposed to external air. In such an approach, the thermal choke point in the heat transfer equation is typically the heat sink to air interface. To maximize heat transfer across this interface, the exposed heat sink surface area is typically maximized, and the heat sink fins are typically oriented to take advantage of any existing air flow over the fins. Unfortunately, such a conventional passive approach does not effectively cool LEDs for various reasons. Thus, in typical LED lighting applications that utilize this approach, the LEDs are often operated at less than half of their available light output capacity, to extend their lifetime and to preserve their efficiency.

Other LED continuous lighting applications utilize a conventional active approach to cooling LEDs that forces air over a finned heat sink with, for example, a powered fan. Another example is a patent pending product, referred to as "SynJet," which uses a diaphragm displacement method to "puff" air over a finned heat sink. While such active approaches may be more effective in removing heat from LEDs than many passive approaches, they have many negative issues. The issues with these active cooling techniques include noise, cost, size, and that the active components may not last as long as the LEDs.

The foregoing examples of the related art and limitations related therewith are intended to be illustrative and not exclusive. Other limitations of the related art will become apparent upon a reading of the specification and a study of the drawings.

SUMMARY

An active cooling assembly is described. One embodiment of the active cooling assembly includes a fin configured to enable convective heat transfer to an airflow passing over the fin. A boundary layer accumulates between the fin and the airflow, and the boundary layer includes a region of heated air attached to a side of the fin. The embodiment also includes a blade configured to oscillate proximate to the fin to shear the boundary layer that accumulates between the fin and the airflow. The region of heated air is sheared from the side of the fin so that the impedance attributable to the boundary layer of the convective heat transfer from the fin to the airflow is reduced. The fin is coupled to a stationary arm, and the blade is coupled to a swing arm. The swing arm and a spring are driven at a resonant frequency by an actuator.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Figure 1:
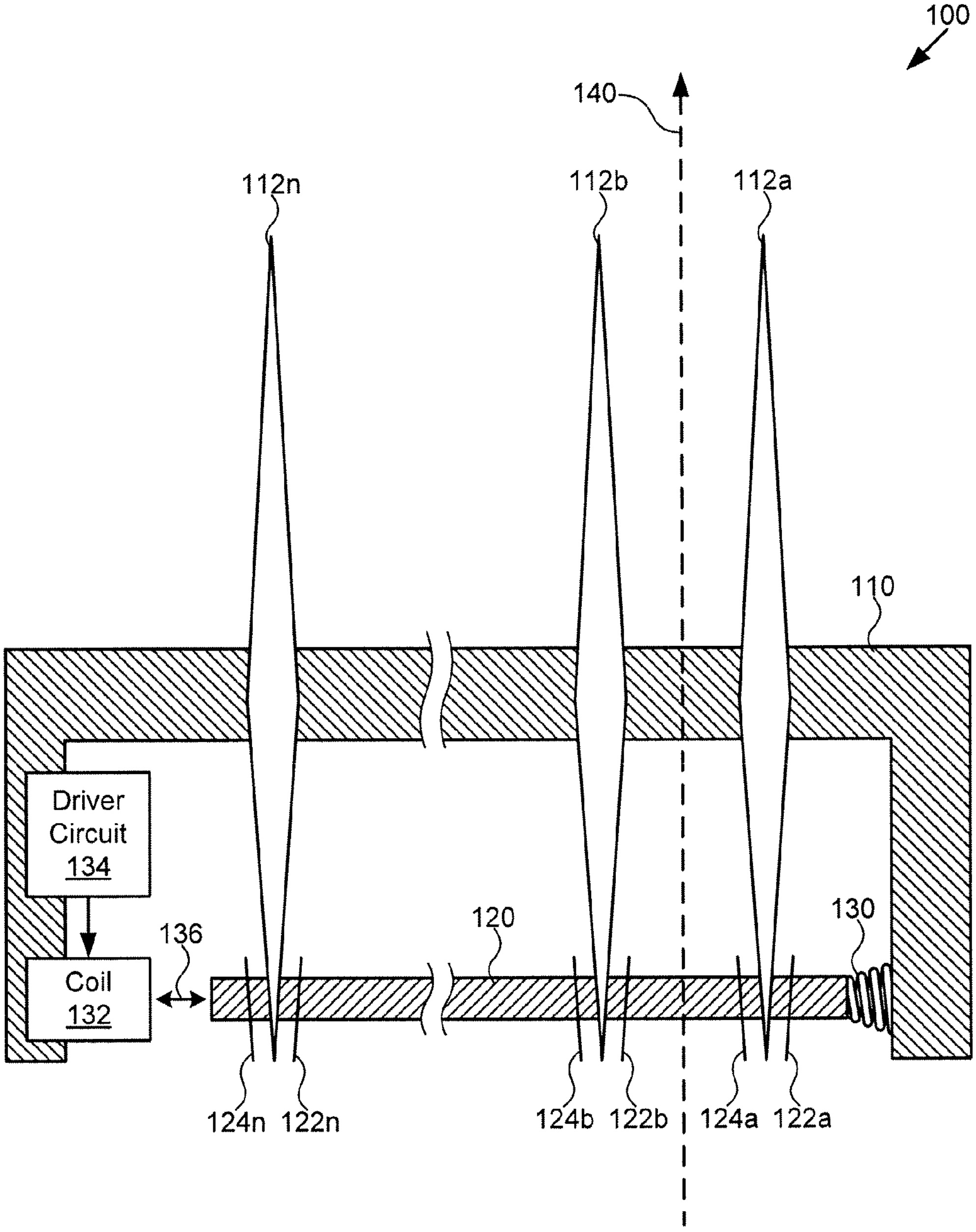
FIG. 1 depicts a block diagram of an active cooling assembly according to an embodiment of the invention.

Described in detail below are methods and systems for active cooling.

Various aspects of the invention will now be described. The following description provides specific details for a thorough understanding and enabling description of these examples. One skilled in the art will understand, however, that the invention may be practiced without many of these details. Additionally, some well-known structures or functions may not be shown or described in detail, so as to avoid unnecessarily obscuring the relevant description. Although the diagrams depict components as functionally separate, such depiction is merely for illustrative purposes. It will be apparent to those skilled in the art that the components portrayed in this figure may be arbitrarily combined or divided into separate components.

The terminology used in the description presented below is intended to be interpreted in its broadest reasonable manner, even though it is being used in conjunction with a detailed description of certain specific examples of the invention. Certain terms may even be emphasized below; however, any terminology intended to be interpreted in any restricted manner will be overtly and specifically defined as such in this Detailed Description section.

The present invention teaches a variety of techniques and mechanisms to actively remove the heat from a heat sink with a compact, reliable device. In one embodiment of the present invention, a plurality of "blades" (e.g., a "rake") are interleaved with the fins of a heat sink. The blades may be made of any suitable material, such as spring steel, that can be agitated at a resonant frequency to form a non-audible, high-frequency (e.g., about 100 Hz), back and forth sweep across the valleys of the heat sink. This action, when suitably constrained (e.g., within about 0.020 inches) to the walls of the heat sink will positively shear the boundary layer accumulating on the heat sink walls. In each sweep the boundary layer is substantially refilled, and then substantially evacuated with the next sweep, as described in detail below.

Further, in various embodiments of the invention, care is taken to size the plurality of blades and the fins of the heat sink with respect to boundary layer dimensions. The blades are configured to oscillate proximate to the fins with respect to the boundary layer dimensions. An arbitrarily large fin spacing or blade size may fail to achieve the close proximity necessary for high cycle rates and effective thermal convection on the fin surfaces. A non-optimal spacing would nevertheless still, in many embodiments, lend improvement over conventional active cooling techniques.

Notably, many embodiments of the present invention lend themselves to "self-cleaning" to a higher degree than conventional active cooling methods and systems. The shearing action discussed below can create high impulse forces for breaking unwanted material free precisely and only at the point of physical contact of the unwanted material. Such impulse forces are more powerful than, for example, a flow of air generated by conventional active cooling methods and systems. This is due, in part, to the inherent formation of a boundary layer and limited associated pressure that such a flow of air can apply against lodged unwanted material. Thus, many embodiments will prevent (or clear out) accumulations of lint or other fibrous as well as point particles very effectively.

One embodiment of the invention is a very compact and effective heat remover that lends itself to products having continuous operation. For example, such an embodiment may be utilized with a variety of lighting applications that requiring continuous operation. In one embodiment of the invention, a lighting apparatus configured for continuous operation comprises a lamp (e.g., an LED) and an active cooling assembly configured to receive heat from the lamp. One embodiment of the invention is also lends itself to products or operations that are so compact that other schemes are not practical. Further, various embodiments achieve high reliability in terms of both self-cleaning and in terms of the reduction or absence of any wearing components.

FIG. 1 depicts a block diagram of active cooling assembly 100 according to one embodiment of the invention. In the example of FIG. 1, active cooling assembly 100 includes stationary arm 110, swing arm 120, spring 130, and coil 132. As discussed below, heat generated by, for example, an LED utilized in a continuous lighting application is removed by convection from active cooling assembly 100 into airflow 140. Airflow 140 may be maintained by, for example, a stack effect (e.g. a "chimney effect").

In one embodiment of the present invention, fin 112*a*, fin 112*b*, and fin 112*n* are coupled to stationary arm 110. Additionally, a plurality of fins, which are not shown in FIG. 1, may be coupled to stationary arm 110 between fin 112*b* and fin 112*n*. Collectively, the fins coupled to stationary arm 110 may be referred to as fins 112. A suitable spacing between pairs of fins in fins 112 is on the order of, for example, of 0.5 to 1.0 millimeters in one embodiment. A suitable height of each fin in fins 112 is, for example, on the order of 10 millimeters in one embodiment. Fins 112 also have a depth not depicted in FIG. 1. In one embodiment, stationary arm 110 provides a fixed platform for fins 112, and ensures an advantageous spacing between each pair of fins in fins 112. Additionally, in some embodiments stationary arm 110 may conduct heat, and thereby may serve as a heat-conductive channel between for example, an LED and fins 112.

In one embodiment, blade 122*a*, blade 124*a*, blade 122*b*, blade 124*b*, blade 122*n*, and blade 124*n* are coupled to swing arm 120. Additionally, a plurality of blades, which are not shown in FIG. 1, may be coupled to swing arm 120 between blade 124*b* and blade 122*n*. Collectively, the blades (e.g., a "rake") coupled to swing arm 120 may be referred to as blades 122 and 124. Swing arm 120 provides, for example, a fixed platform for blades 122 and 124, and ensures an advantageous spacing between each pair of blades in blades 122 and 124. Blades 122 and 124 are implemented, in one embodiment, with laser-cut sheet metal. In one embodiment the distance between blade 124*a* and fin 112*a* is less than the distance between blade 124*a* and blade 122*b*.

Each blade in blades 122 and 124 may be inserted into a plastic mold cavity wherein swing arm 120 is injection molded around blades 122 and 124. Blades 122 and 124 are designed, in some embodiments, to fit as closely as possible within manufacturing tolerances to the sides of fins 112. Blades 122 and 124 are thus proximate to respective fins in fins 112. Although blades 122 and 124 are depicted as angled blades in FIG. 1, in other embodiments blades 122 and 124 may be, for example, straight blades. Further, in various embodiments blades 122 and 124 may have, for example, rectangular cross sections, curved cross sections, aerodynamic cross sections, or other cross sections. Also, in various embodiments fins 112 may have, for example, rectangular cross sections, curved cross sections, aerodynamic cross sections, or other cross sections.

As shown in FIG. 1, in one embodiment driver circuit 134 and coil 132 are coupled to stationary arm 110. Coil 132 may be implemented as, for example, a voice coil or other electric coil configured to exert a driving force. Generally, coil 132 is an actuator for exerting a driving force on swing arm 120, and may also be implemented as, for example, a mechanical actuator, a hydraulic actuator, a piezoelectric actuator, or another actuator. Coil 132 may be operated by driver circuit 134, which is configured to apply power to coil 132 so that coil 132 exerts the driving force. Driver circuit 134 may be additionally coupled to a power supply (not shown). Active cooling assembly 100 may also include a permanent magnet air gap with optional soft iron to close the magnetic flux loop with coil 132, but is not limited to such. In one embodiment, a magnet may be attached to swing arm 120, with coil 132 stationary and adjacent. Swing arm 120 may be streamlined to provide only minimal air drag or air agitation relative to blades 122 and 124.

Coil 132 may exert a driving force on swing arm 120 in the directions shown by line 136. Spring 130, in one embodiment a metal spring, is configured to resist or reinforce the driving force exerted by coil 132, depending on the compression or extension of spring 130. In one embodiment, coil 132 thus exerts a driving force on swing arm 120 in a direction perpendicular to the direction of airflow 140. Swing arm 120 may be constrained by, for example, guides or slots to move only in the directions shown by line 136, and not in any other direction.

In one embodiment, coil 132, spring 130, and swing arm 120 may operate in a resonant mode. During such operation, swing arm 120 may oscillate back and forth in the directions of line 136 at a natural frequency determined by, for example, the mass of swing arm 120 and blades 122 and 124, as well as the spring constant of spring 130. While operating in such a resonant mode, the driving force may be, advantageously, as low as the average drag loss experienced by swing arm 120. Further, while operating in such a resonant mode the velocity reversals of swing arm 120 are predominantly achieved by the alternating spring and mass energies, thereby minimizing driving force peak power requirements on driver circuit 134 and coil 132.

In one embodiment, an enclosure around fins 112 can provide "flapper" valves (e.g. Mylar film valves) for a net flow action. In such an embodiment, lower intake valves operate in concert with upper exit valves. The valves consist, in one embodiment, of a thin patch of Mylar machine-applied over a port in the enclosure, in a similar manner to an adhesive label, for example. Such valves enable the net transport movement of air in one embodiment.

Figure 2:
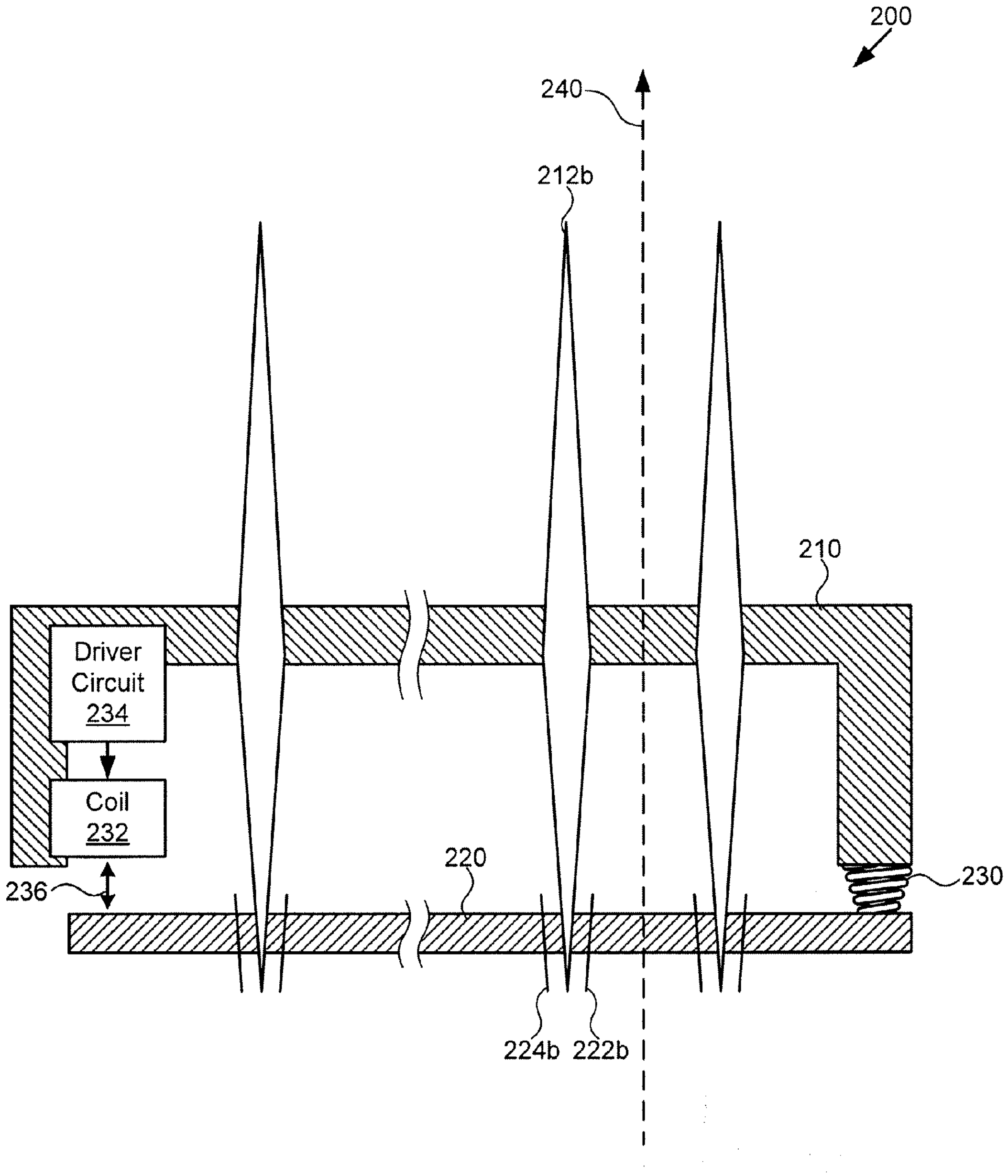
FIG. 2 depicts a block diagram of an active cooling assembly according to an embodiment of the invention.

FIG. 2 depicts a block diagram of active cooling assembly 200 according to one embodiment of the invention. Active cooling assembly 200 includes stationary arm 210, swing arm 220, and spring 230, which correspond to stationary arm 110, swing arm 120, and spring 130, of active cooling assembly 100 except as discussed below.

As shown in FIG. 2, in one embodiment driver circuit 234 and coil 232 are coupled to stationary arm 210. Coil 232 exerts a driving force in a manner similar to coil 132, in the directions shown by line 236. Spring 230 is configured to resist or reinforce the driving force exerted by coil 232, in a manner similar to spring 130. Swing arm 220 may be constrained by, for example, guides or slots to move only in the directions shown by line 236, and not in any other direction. Coil 232, spring 230, and swing arm 220 may operate in a resonant mode in a manner similar to coil 132, spring 130, and swing arm 120. Notably, in contrast with the embodiment of FIG. 1, coil 232 exerts a driving force on swing arm 220 in a direction parallel to the direction of airflow 240, rather than perpendicular.

In various other embodiments of the invention, the driving force exerted by coil 232 can be configured to move swing arm 220 in other directions. For example, instead of exerting a driving force in the direction of line 236 (or, for example, in the direction of line 136 in FIG. 1), in one embodiment a coil may exert a driving force which causes the swing arm to move in a circular motion, or in an ellipsoidal motion, or in another complex motion. Further, in some embodiments, the motion of the swing arm is not constrained to two dimensions, as suggested by line 236, for example. Instead, the swing arm may move substantially in three dimensions in response to the driving force.

Figure 3A:
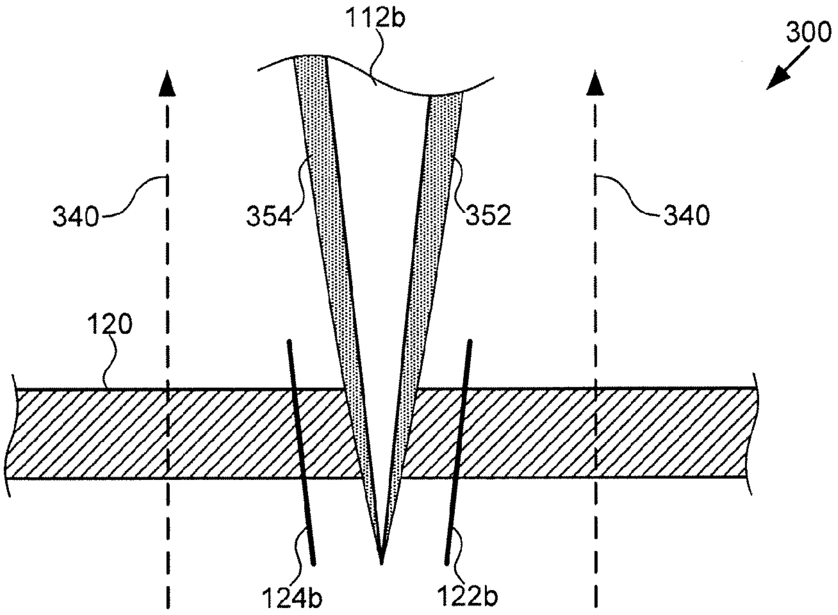
FIG. 3*a* depicts a block diagram of a portion of an active cooling assembly according to an embodiment of the invention.
Figure 3B:
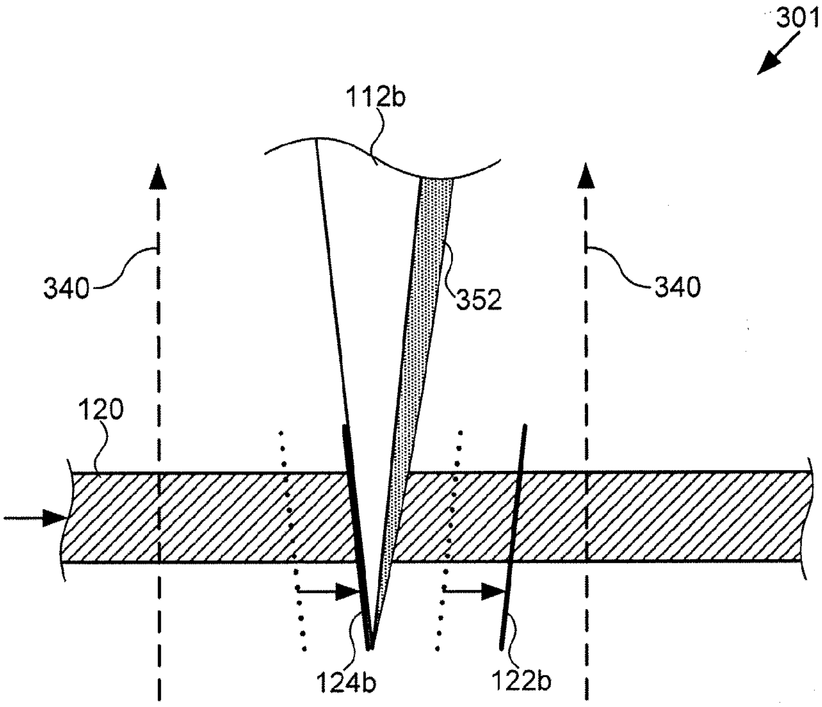
FIG. 3*b* depicts a block diagram of a portion of an active cooling assembly according to an embodiment of the invention.

FIG. 3*a* and FIG. 3*b* depict detail 300 and detail 301, respectively, which show block diagrams of a portion of active cooling assembly 100 of FIG. 1. Detail 300 shows the portion at a first point in time, and detail 301 shows the portion at a second, later point in time. The portion of active cooling assembly 100 shown includes swing arm 120, fin 112*b*, blade 122*b*, and blade 124*b*. At the point in time of detail 300, blade 122*b* and blade 124*b* are equidistant from a centerline of fin 112*b*. Later, at the point in time of detail 301, swing arm 120, blade 122*b*, and blade 124*b* have translated to the right (e.g., in a direction of line 136 shown in FIG. 1) relative to fin 112*b*. Although blade 124*b* is shown contacting fin 122*b* at the time of detail 301, in some embodiments, blade 124*b* approaches but does not actually contact fin 122*b*.

As depicted in FIG. 3*a* and FIG. 3*b*, the amount of time between the times of detail 300 and detail 301 is substantially equal to one quarter of a full period of oscillation of swing arm 120. Thus, a third depiction of the portion of active cooling assembly 100 at one half of a full period would show swing arm 120 returned to the position shown in detail 300. Subsequently, a fourth depiction of the portion of active cooling assembly 100 at three quarters of a full period would show swing arm 120 translated to the left relative to fin 112*b*.

Also depicted in FIG. 3*a* and FIG. 3*b* is airflow 340, which corresponds substantially to airflow 140, and which represents an airflow on both sides of fin 112*b*, between fin 112*b* and adjacent fins. At the point in time of detail 300, boundary layer 354 and boundary layer 352 have accumulated on each side of fin 112*b*. Boundary layer 354 and boundary layer 352, which are regions of heated air "attached" to the sides of fin 112*b*, generally degrade the ability of airflow 340 to remove heat from fin 112*b*, as known in the art.

At the point in time of detail 301, blade 124*b* has translated to the right, and has therefore sheared boundary layer 354 from the left side of fin 112*b*. Boundary layer 354 is thus omitted from FIG. 3*b*. The ability of airflow 340 to remove heat from the left side of fin 112*b* is greatly improved by the absence of boundary layer 354. Subsequently, swing arm 120, blade 122*b*, and blade 124*b* will translate back to a center position, and then to the left, as discussed above. Boundary layer 352 will therefore be sheared from the right side of fin 112*b* in turn. In this novel manner, boundary layer 354 and boundary layer 352 are alternately substantially evacuated as swing arm 120 oscillates back and forth.

Figure 4A:
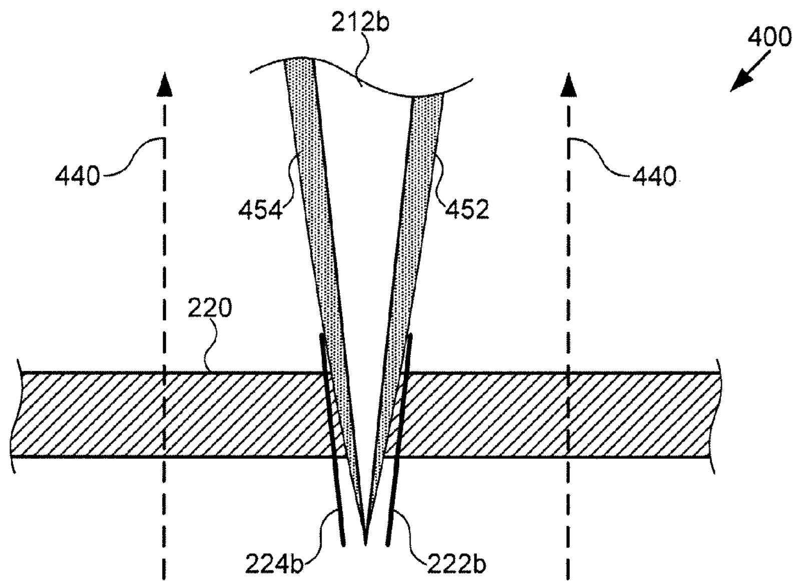
FIG. 4*a* depicts a block diagram of a portion of an active cooling assembly according to an embodiment of the invention.
Figure 4B:
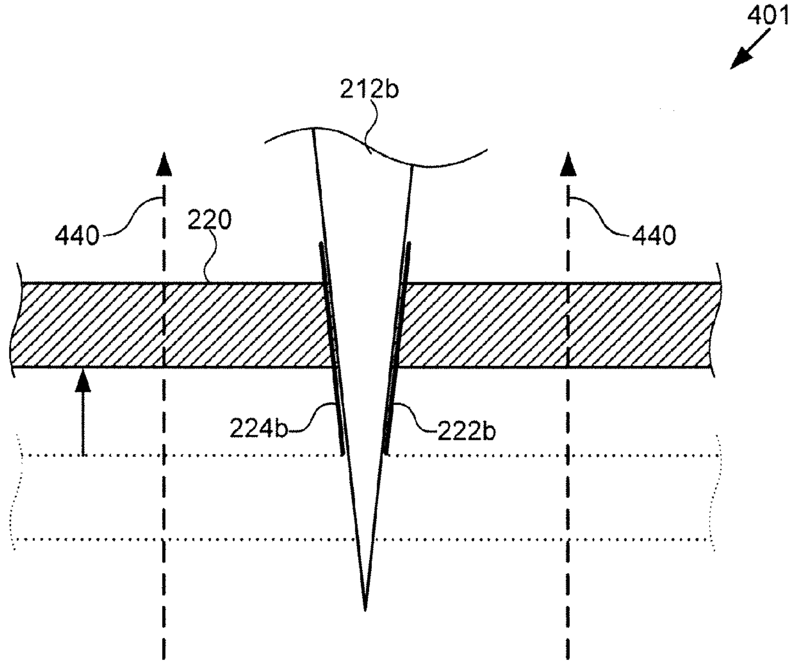
FIG. 4*b* depicts a block diagram of a portion of an active cooling assembly according to an embodiment of the invention.

FIG. 4*a* and FIG. 4*b* depict detail 400 and detail 401, respectively, which show block diagrams of a portion of active cooling assembly 200 of FIG. 2. Detail 400 shows the portion at a first point in time, and detail 401 shows the portion at a second, later point in time. The portion of active cooling assembly 200 shown includes swing arm 220, fin 212*b*, blade 222*b*, and blade 224*b*. At the points in time of both detail 400 and detail 401, blade 222*b* and blade 224*b* are equidistant from a centerline of fin 212*b*. At the point in time of detail 401, swing arm 220, blade 222*b*, and blade 224*b* have translated upwards (e.g., in a direction of line 236 shown in FIG. 2) relative to fin 212*b*, and relative to the positions shown in detail 400. Although blade 222*b* and blade 224*b* are shown contacting fin 222*b* at the time of detail 401, in some embodiments, blade 222*b* and blade 224*b* approach but do not actually contact fin 222*b*.

The amount of time between the times of detail 400 and detail 401 are similar to the amount of time between the times of detail 300 and detail 301 as depicted in FIG. 3*a* and FIG. 3*b*. In another embodiment, however, the amount of time between the times of detail 400 and detail 401 is substantially equal to one half of a full period of oscillation of swing arm 220, rather than one quarter of a full period. In one embodiment, for example, a third depiction of the portion of active cooling assembly 200 at one full period would show swing arm 220 returned to the position shown in detail 400.

FIG. 4*a* and FIG. 4*b* depict airflow 440, which is similar in some regards to airflow 340, and which represents an airflow on both sides of fin 212*b*, between fin 212*b* and adjacent fins. At the point in time of detail 400, boundary layer 454 and boundary layer 452 have accumulated on each side of fin 212*b*. Boundary layer 454 and boundary layer 452 are regions of heated air similar to boundary layer 354 and boundary layer 352, and generally degrade the ability of airflow 440 to remove heat from fin 212*b*.

At the point in time of detail 401, swing arm 220, blade 222*b*, and blade 224*b* have translated upwards, and have therefore sheared boundary layer 454 and boundary layer 452 from the sides of fin 212*b*. Boundary layer 454 and boundary layer 452 are thus omitted from FIG. 4*b*. The ability of airflow 440 to remove heat from the sides of fin 212*b* is thus greatly improved, in a manner similar to the improvement discussed above related to FIG. 3*a* and FIG. 3*b*.

Figure 5:
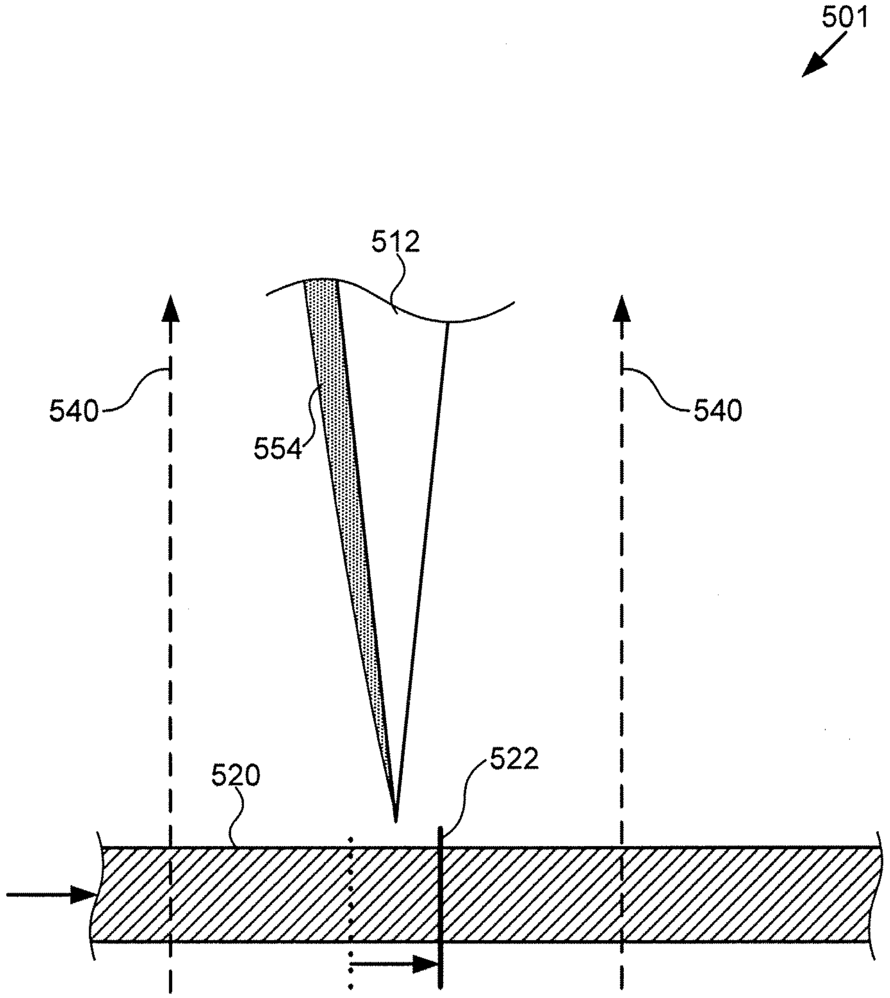
FIG. 5 depicts a block diagram of a portion of an active cooling assembly according to an embodiment of the invention.

FIG. 5 depicts detail 501, which shows a block diagram of a portion of an active cooling assembly which varies from active cooling assembly 100 and active cooling assembly 200 of FIG. 1 and FIG. 2, respectively. The portion of the active cooling assembly shown includes swing arm 520, fin 512, and blade 522. Swing arm 520 oscillates back and forth in a manner similar to swing arm 120, for example. At the point in time of detail 501, blade 522 has translated from the left side of fin 512 to the right side of fin 512. Later, blade 522 may translate back, in a manner similar to the translations discussed above with respect to FIG. 3*a* and FIG. 3*b*, for example. Notably, in contrast with, for example, blade 122*b* or blade 124*b* of FIG. 3*a* and FIG. 3*b*, blade 522 is configured to shear both sides of fin 512.

Depicted in FIG. 5 is airflow 540, which represents an airflow on both sides of fin 512, between fin 512 and adjacent fins (not shown). At the point in time of detail 501, boundary layer 554 has accumulated on the left side of fin 512, but blade 522 has sheared a boundary layer from the right side of fin 512. The ability of airflow 540 to remove heat from the right side of fin 512 is thus greatly improved. Subsequently, swing arm 520 and blade 522 will translate back to a center position and then to the left side. Boundary layer 554 will therefore be sheared from the left side of fin 512 in turn. In this novel manner, boundary layers on the left and right side of fin 512 are alternately substantially evacuated by a single blade, for example blade 522, as swing arm 520 oscillates back and forth.

Figure 6:
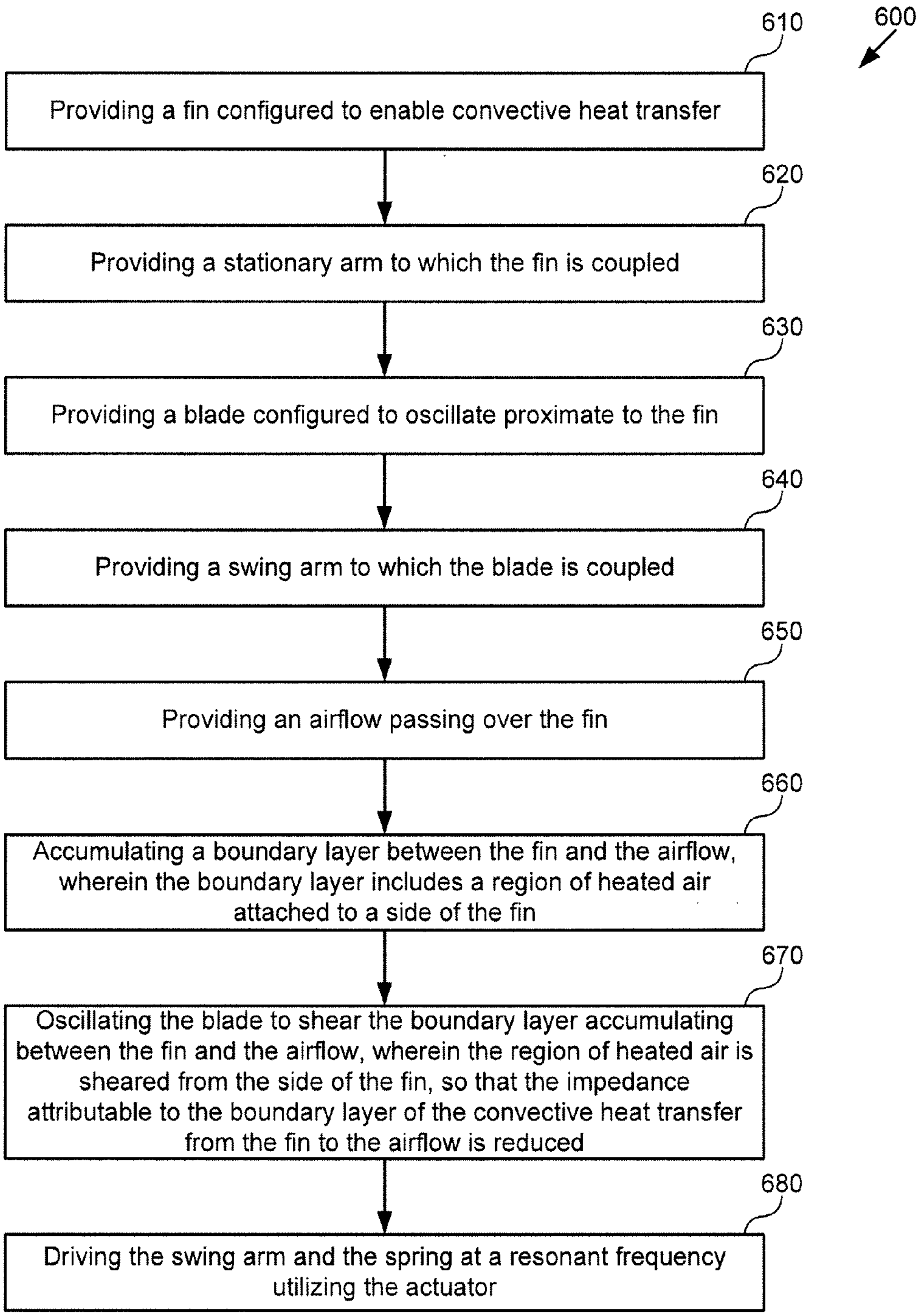
FIG. 6 depicts flowchart of a method for active cooling according to one embodiment of the present invention.

Depicted in FIG. 6 is flowchart 600, which depicts a method for active cooling according to one embodiment of the present invention. The method for active cooling can be performed utilizing, for example, the embodiment of FIG. 1, the embodiment of FIG. 2, or another embodiment. The method includes providing a fin configured to enable convective heat transfer, providing a stationary arm to which the fin is coupled, providing a blade configured to oscillate proximate to the fin, providing a swing arm to which the blade is coupled, and providing an airflow passing over the fin. The method also includes constraining the swing arm to move in a direction, providing an actuator configured to drive the swing arm, providing a spring configured to be coupled to the swing arm, and driving the swing arm and the spring at a resonant frequency utilizing the actuator. Further, the method also includes accumulating a boundary layer between the fin and the airflow, wherein the boundary layer includes a region of heated air attached to a side of the fin, and oscillating the blade to shear the boundary layer accumulating between the fin and the airflow, wherein the region of heated air is sheared from the side of the fin, so that the impedance attributable to the boundary layer of the convective heat transfer from the fin to the airflow is reduced.

The words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The foregoing description of various embodiments of the claimed subject matter has been provided for the purposes of illustration and description. It is not intended to be exhaustive or to limit the claimed subject matter to the precise forms disclosed. Many modifications and variations will be apparent to the practitioner skilled in the art. Embodiments were chosen and described in order to best describe the principles of the invention and its practical application, thereby enabling others skilled in the relevant art to understand the claimed subject matter, the various embodiments and with various modifications that are suited to the particular use contemplated.

The teachings of the invention provided herein can be applied to other systems, not necessarily the system described above. The elements and acts of the various embodiments described above can be combined to provide further embodiments.

While the above description describes certain embodiments of the invention, and describes the best mode contemplated, no matter how detailed the above appears in text, the invention can be practiced in many ways. Details of the system may vary considerably in its implementation details, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

What is claimed is:

1. An active cooling assembly comprising:

a fin configured to enable convective heat transfer to an airflow passing over the fin, wherein a boundary layer accumulates between the fin and the airflow, and wherein the boundary layer includes a region of heated air adjacent to a side of the fin;

a blade configured to oscillate proximate to the fin to shear the boundary layer that accumulates between the fin and the airflow, wherein the region of heated air is sheared from the side of the fin, so that the impedance attributable to the boundary layer of the convective heat transfer from the fin to the airflow is reduced; and a swing arm coupled to the blade, wherein the swing arm oscillates with a translatory motion to cause the oscillation of the blade, and further wherein the oscillation of the blade translationaly displaces an entirety of the blade.

2. The active cooling assembly of claim 1, further comprising a stationary arm to which the fin is coupled.

3. The active cooling assembly of claim 2, wherein the swing arm is configured to move relative to the stationary arm.

4. The active cooling assembly of claim 1, wherein the swing arm is configured to be driven by an actuator.

5. The active cooling assembly of claim 4, wherein the swing arm is coupled to a spring.

6. The active cooling assembly of claim 5, wherein the actuator is configured to drive the swing arm and the spring at a resonant frequency.

7. The active cooling assembly of claim 1 further comprising:

a lamp; and wherein the fin is configured to receive heat from the lamp.

8. The active cooling assembly of claim 7, wherein the lamp comprises a light emitting diode.

9. An active cooling assembly comprising:

a heat sink comprising a plurality of fins that are configured to enable convective heat transfer to an airflow passing over the plurality of fins, wherein boundary layers accumulate between sides of each of the plurality of fins and the airflow, and wherein the boundary layers include regions of heated air adjacent to the sides of each of the plurality of fins;

a rake comprising a plurality of blades configured to oscillate proximate to each of the plurality of fins to shear the boundary layers that accumulate between the sides of the plurality of fins and the airflow, wherein the regions of heated air are sheared from the sides of each of the plurality of fins, so that the impedance attributable to the boundary layers of the convective heat transfer from the plurality of fins to the airflow is reduced; and a swing arm coupled to the rake, wherein the swing arm oscillates with a translatory motion to cause the oscillation of the rake, and further wherein the oscillation of the rake translationally displaces an entirety of the rake.

10. The active cooling assembly of claim 9, further comprising a stationary arm to which the plurality of fins are coupled.

11. The active cooling assembly of claim 10, wherein the swing arm is configured to move relative to the stationary arm.

12. The active cooling assembly of claim 9, wherein the swing arm is configured to be driven by an actuator.

13. The active cooling assembly of claim 12, wherein the swing arm is coupled to a spring.

14. The active cooling assembly of claim 13, wherein the actuator is configured to drive the swing arm and the spring at a resonant frequency.

15. The active cooling assembly of claim 9 further comprising:

a lamp, wherein the fin is configured to receive heat from the lamp.

16. The active cooling assembly of claim 15, wherein the lamp comprises a light emitting diode.

17. A method for active cooling, the method comprising:

providing a fin configured to enable convective heat transfer;

providing a blade configured to oscillate proximate to the fin;

providing an airflow passing over the fin;

accumulating a boundary layer between the fin and the airflow, wherein the boundary layer includes a region of heated air adjacent to a side of the fin;

providing a swing arm coupled to the blade, wherein the swing arm oscillates with a translatory motion to cause the oscillation of the blade; and oscillating the blade to shear the boundary layer accumulating between the fin and the airflow, wherein the region of heated air is sheared from the side of the fin, so that the impedance attributable to the boundary layer of the convective heat transfer from the fin to the airflow is reduced, wherein the oscillation of the blade translationally displaces an entirety of the blade.

18. The method of claim 17, further comprising providing a stationary arm to which the fin is coupled.

19. The method of claim 17, further comprising providing an actuator configured to drive the swing arm.

20. The method of claim 19, further comprising providing a spring configured to be coupled to the swing arm.

21. The method of claim 20, further comprising driving the swing arm and the spring at a resonant frequency utilizing the actuator.

* * * * *